United States Patent
Chang et al.

(10) Patent No.: US 9,413,518 B2
(45) Date of Patent: Aug. 9, 2016

(54) CLOCK DATA RECOVERY CIRCUIT

(71) Applicant: NVIDIA CORPORATION, San Jose, CA (US)

(72) Inventors: Yu Chang, Los Altos, CA (US); Huabo Chen, San Jose, CA (US); Hakki Ozguc, San Jose, CA (US); Michael Hopgood, San Jose, CA (US)

(73) Assignee: NVIDIA CORPORATION, Santa Clara, CA (US)

( * ) Notice: Subject to any disclaimer, the term of this patent is extended or adjusted under 35 U.S.C. 154(b) by 0 days.

(21) Appl. No.: 13/964,448

(22) Filed: Aug. 12, 2013

(65) Prior Publication Data

US 2015/0043698 A1    Feb. 12, 2015

(51) Int. Cl.
  *H03D 3/18*   (2006.01)
  *H04L 7/00*   (2006.01)
  *H04L 27/227*  (2006.01)
  *H04L 27/00*  (2006.01)

(52) U.S. Cl.
  CPC ............ *H04L 7/0041* (2013.01); *H04L 7/0016* (2013.01); *H04L 27/2273* (2013.01); *H04L 2027/0057* (2013.01)

(58) Field of Classification Search
  CPC ............. H04L 7/0012; H04L 27/2273; H04L 2027/0057
  See application file for complete search history.

(56) References Cited

U.S. PATENT DOCUMENTS

| | | | |
|---|---|---|---|
| 5,436,937 A | 7/1995 | Brown et al. | |
| 8,259,890 B2 | 9/2012 | Chen et al. | |
| 8,791,735 B1 | 7/2014 | Shibasaki | |
| 9,184,907 B2 | 11/2015 | Mills et al. | |
| 9,231,802 B2 | 1/2016 | Zhong et al. | |
| 2004/0091064 A1* | 5/2004 | Cao et al. | 375/316 |
| 2004/0091073 A1 | 5/2004 | Smith et al. | |
| 2004/0202266 A1 | 10/2004 | Gregorius et al. | |
| 2005/0180536 A1 | 8/2005 | Payne et al. | |
| 2006/0114069 A1* | 6/2006 | Kojima et al. | 331/16 |
| 2006/0158262 A1* | 7/2006 | Robinson et al. | 331/16 |
| 2009/0296867 A1* | 12/2009 | Do et al. | 375/371 |
| 2010/0103999 A1 | 4/2010 | Leibowitz | |
| 2011/0243215 A1 | 10/2011 | Wu et al. | |
| 2012/0033773 A1* | 2/2012 | Nedovic | 375/371 |
| 2012/0106539 A1 | 5/2012 | Ferraiolo | |
| 2012/0106687 A1 | 5/2012 | Bulzacchelli et al. | |
| 2012/0128055 A1 | 5/2012 | Jiang | |
| 2012/0151247 A1 | 6/2012 | Ferraiolo | |
| 2012/0250811 A1* | 10/2012 | Misek et al. | 375/371 |
| 2013/0070882 A1* | 3/2013 | Nedovic | 375/373 |
| 2013/0154698 A1 | 6/2013 | Bottelli et al. | |
| 2013/0249612 A1 | 9/2013 | Zerbe et al. | |
| 2014/0016692 A1 | 1/2014 | Leibowitz et al. | |
| 2014/0177693 A1 | 6/2014 | Zhong et al. | |
| 2014/0185633 A1 | 7/2014 | Mills et al. | |
| 2015/0010047 A1 | 1/2015 | Zhong et al. | |

FOREIGN PATENT DOCUMENTS

TW       201228304       4/2009

* cited by examiner

*Primary Examiner* — Santiago Garcia

(57) ABSTRACT

Systems and methods for stabilizing clock data recovery (CDR) by filtering the abrupt phase shift associated with data pattern transition in the input signal. The CDR circuit includes a data pattern detector coupled to a data pattern filter. The data pattern detector is capable of detecting the data patterns of the input signal. Accordingly, the data pattern filter can selectively generate a filter indication indicating to freeze or suppress the CDR phase caused by data pattern transition. The filter indication can be incorporated to a phase error signal, a gain function, and/or the control voltage driving the VCO.

20 Claims, 10 Drawing Sheets

SKP Ordered Set with 128b/130b Encoding

| Symbol Number | Value | Description |
|---|---|---|
| 0 through (4*N - 1) [N can be 1 through 5] | AAh | SKP Symbol. Symbol 0 is the SKP Ordered Set identifier. |
| 4*N | E1h | SKP_END Symbol. Signifies the end of the SKP Ordered Set after three more Symbols. |
| 4*N + 1 | 00-FFh | (i) If LTSSM state is Polling.Compliance: AAh (ii) Else if prior block was a Data Block: |

Fig. 1

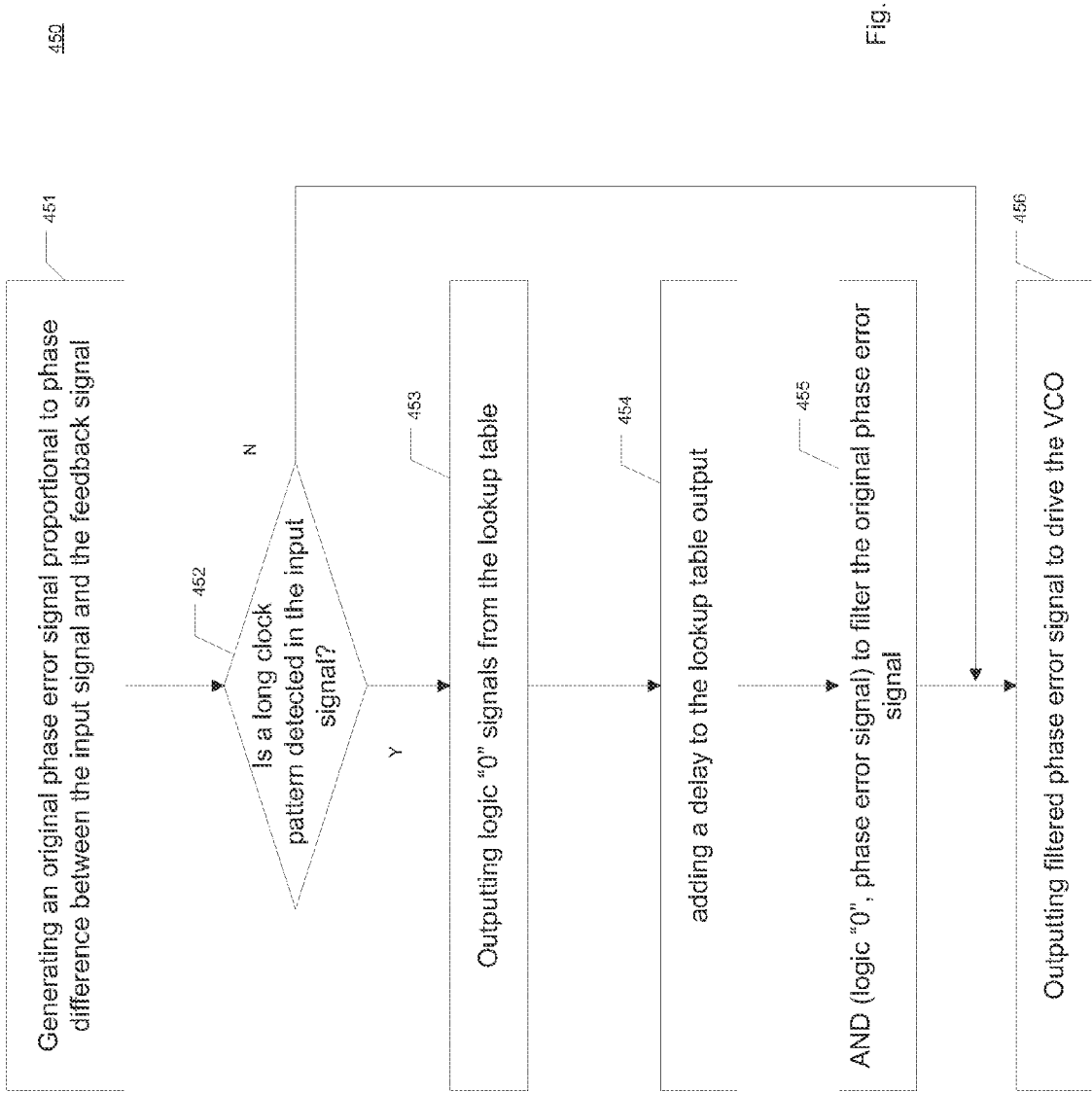

CLOCK DATA RECOVERY CIRCUIT

TECHNICAL FIELD

The present disclosure relates generally to the field of data transmission, and, more specifically, to the field of clock data recovery for data transmission.

BACKGROUND

As data rates continue to increase, it is becoming increasingly difficult to match the data and timing signal lines to eliminate timing skews. Using a dedicated time signal line to be routed along with the data lines is costly in terms of chip area and power. Thus, in a high speed SERDES link, a clock data recovery (CRD) circuit is commonly used on the receiver to align a sampling clock with incoming data adaptively. Such a CDR circuit only utilizes the data signal itself to determine when to sample the signal to reliably extract the data, and therefore a time line is no longer needed from the link. By virtue of clock recovery, a CDR circuit can synchronize a receiver clock with the transmitter clock generated for the signal. And by virtue of phase selection, a CDR circuit can select a phase with respect to the receiver clock at which to sample the received signal in order to provide a good signal-to-noise ratio (SNR) for accurate data recovery.

The Peripheral Component Interconnect Express (PCIe) 3.0 architecture adopts the encoding scheme of 128b/130b, where a data block can include 2 bits synchronization header followed by 128 bits scrambled payload. A SKP ordered sets can be used to compensate for differences in frequencies between bit rates at two ends of a link. In a typical data block, data are transmitted in the form of a pseudo random binary sequence (PRBS) following a SKP pattern. Hence, at the receiver side, not only the PRBS bits are received, but also the SKP ordered set bits are received in clock pattern. FIG. 1 is a table listing the values of the SKP ordered sets used for equalization in a high speed series link in compliance with the Based Specification for PCIe 3.0.

A conventional CDR circuit essentially comprises a phase frequency detector (PFD) coupled to a voltage controlled oscillator (VCO) through a low pass filter (LPF), and optionally through an up/down counter. The PFD can detect a phase frequency difference between an input data and a feedback signal recovered clock (e.g. a recovered clock) that samples the input data in the CDR loop and generate a phase error signal accordingly. The phase error signal, after filtered through the LPF and converted to a control voltage, controls the oscillating output frequency of the VCO which is also the output of the CDR loop so as to minimize the phase difference between the input signal and the output signal of the CDR loop.

In the context of data transmission based on PCIe 3.0, the input signal may include a clock pattern and a PRBS pattern. It has been observed that a CDR often locks at different phase for these two patterns. FIG. 2 is a phase diagram depicting the transient simulation of CDR locked phases when a Modified Compliance Pattern (MCP) that passes a PCIe 3.0 RX (receiver) compliance test channel and is fed to a CDR circuit in accordance with the prior art. The data plot 200 simulates an output of a phase interpolator in the CDR circuit in response to the MCP which includes PRBS bits and SKP pattern as defined in the Based Specification of PCIe 3.0. The plot for the time periods 201 and 203 represents the PRBS locked phases that fluctuate in a small range and with an average of 29 (a.u.). In contrast, the plot for the time period 202 represents the locked phases for the clock pattern with a valley of 21 (a.u.). As illustrated, the data plot 200 demonstrates that the CDR phase can be abruptly dragged down from a PRBS locked phase to a remarkably lower locked phase for the clock pattern.

Generally speaking, due to the inherently unequal propagation delays for the two inputs of the phase detector, most phase detectors that operate properly with random data are asymmetric with respect to the data and clock inputs, thereby introducing a systematic skew between the two in phase lock condition. When receiving a PRBS signal, the CDR typically produces a sampling clock at the midpoint in the data eye. The significant phase shift in response to the transitions between a PRBS and a clock pattern can cause a sampling clock of the CDR to shift by 10% UI, resulting in loss of timing margin for clock data recovery by 10%.

SUMMARY OF THE INVENTION

It would be advantageous to provide a mechanism to throttle the abrupt shift of CDR locked phase that is caused by transition from a random pattern to a clock pattern, and thereby preserve its timing margin.

Accordingly, embodiments of the present disclosure employ a filtering process to suppress the abrupt phase shift associated with data pattern transition in the input signal. The CDR circuit includes a data pattern detector coupled to a data pattern filter. The data pattern detector is capable of detecting the data patterns present in the input signal. Accordingly, the data pattern filter can selectively generate a filter indication indicating to freeze or to suppress the CDR phase shift caused by data pattern transition. The filter indication can be incorporated to a phase error signal, a gain function, and/or the control voltage driving the VCO.

In one embodiment of present disclosure, a method of reconstructing clock signal according to input signal in a data transmission receiver comprises (1) receiving an input signal comprising a plurality of data patterns; (2) detecting a phase difference between the inputs and the feedback signal of a CDR circuit; (3) detecting a data pattern of the input; (4) generating a control signal in accordance with the phase difference and the data pattern; and (5) providing the control signal to an oscillator circuit to generate an output signal of the CDR. The method may further comprise: (1) generating a first phase error signal based on the phase difference; (2) modifying the first phase error signal to generate a second phase error signal, in response to detection of the first data pattern, until detection of the second data pattern; and (3) generating the control signal based on the second phase error signal. Alternatively, the method may further comprise: generating a phase error signal based on a phase difference; and converting the phase error signal to the control signal by multiplying it by a gain function, wherein the gain function may be a substantially minimal value if the first data pattern in detected until the second data pattern is detected.

In another embodiment of present disclosure, a clock data recovery (CDR) circuit comprises a phase frequency detector, a data pattern filter, and an oscillating element. The phase frequency detector is configured to receive an input signal comprising a first data pattern and a second data pattern, and configured to generate a phase error signal representing a phase difference between the input signal and a feedback signal of the CDR circuit. The data pattern filter is configured to detect data patterns of the input signal; and to generate a filtering indication in response to detection of the first data pattern within the input signal. The oscillating element is coupled to the data pattern filter and configured to generate an output signal of the CDR circuit in response to a control signal that is determined by the phase difference and the filtering indication. The data pattern filter may comprise a lookup table and multiplication logic. The lookup table may be configured to: detect data patterns of the input signal; and output a minimal coefficient as the filter indication upon detection of the first data pattern within the input signal. The multiplication logic may be configured to multiply the minimal coefficient with a control signal output from the up/down counter in response to detection of the first data pattern; and to output a scaled control signals that is provided to the oscillating element. Alternatively, the data pattern filter may comprises a lookup and an AND logic module. The lookup table may be configured to: detect data patterns of the input signal; output a logic "0" as the filtering indication in response to detection of the first data pattern within the input signal; and output a logic "1" in response to detection of the second data pattern within the input signal. The AND logic module may perform an AND operation between an output of the lookup table and the phase error signal to generate a modified phase error signal that is provided to the up/down counter.

In another embodiment of present disclosure, an integrated circuit for clock and data recovery from data received through a series link comprises a phase frequency detector, a lookup table, and a voltage controlled oscillator (VCO). The phase frequency detector is configured to: receive an input signal comprising a first component and a second component; detect a phase difference between the input signal and a feedback signal of a clock data recovery (CDR) loop; and to generate a first phase error signal. The lookup table can identify the first component within the input signal; and output a filter indication in response to identifying the first component. The voltage controlled oscillator (VCO) can generate a clock signal at an output of the CDR in response to a control signal that is determined by the phase difference and the filter indication.

This summary contains, by necessity, simplifications, generalizations and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

Embodiments of the present invention will be better understood from a reading of the following detailed description, taken in conjunction with the accompanying drawing figures in which like reference characters designate like elements and in which:

FIG. 1 is a table listing the values of the SKP ordered sets used for equalization in a high speed series link in compliance with the Based Specification for PCIe 3.0.

FIG. 4B is a flow chart depicting an exemplary method of generating a filtered phase error signal based on the data pattern of the input signal in accordance with an embodiment of the present disclosure.

DETAILED DESCRIPTION

Figure 2:
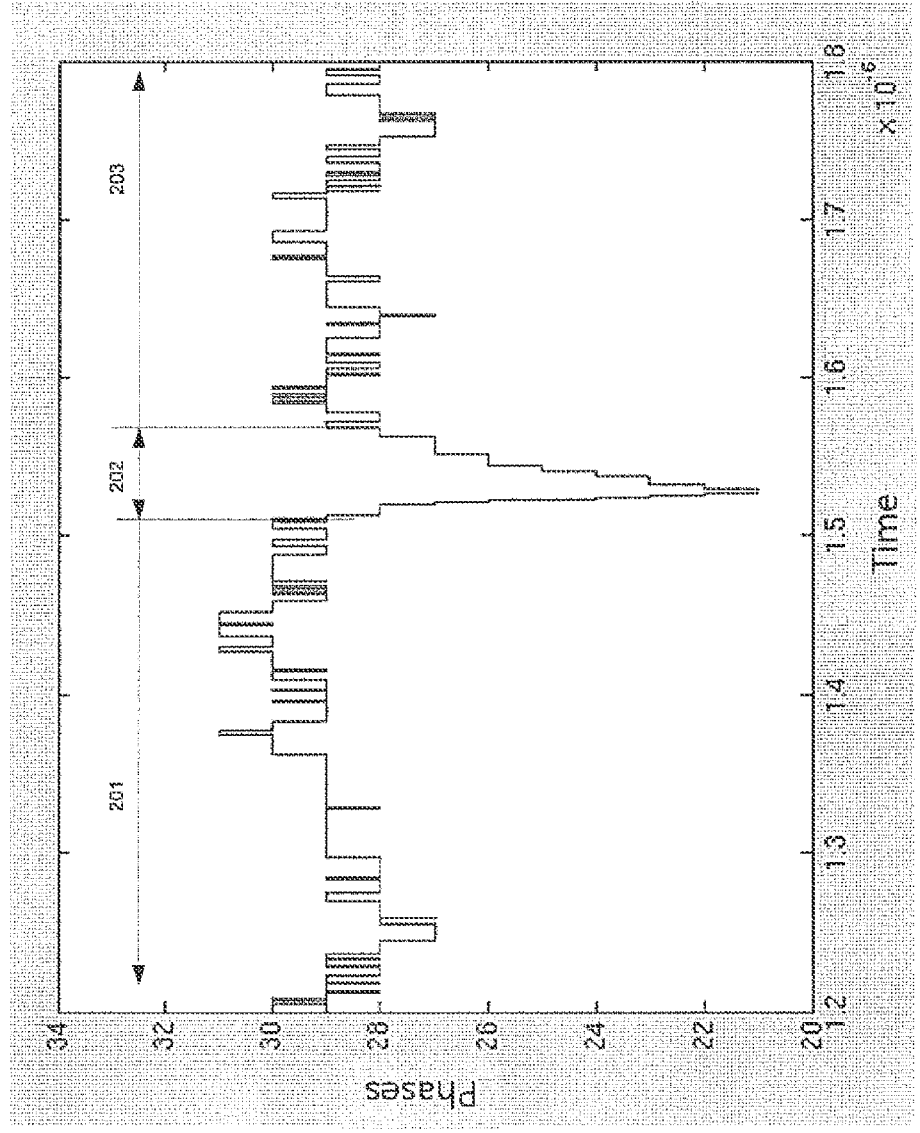
FIG. 2 is a phase diagram depicting the transient simulation of CDR locked phases when a Modified Compliance Pattern (MCP) that passes a PCIe 3.0 RX (receiver) compliance test channel and is fed to a CDR circuit in accordance with the prior art.

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail so as not to unnecessarily obscure aspects of the embodiments of the present invention. The drawings showing embodiments of the invention are semi-diagrammatic and not to scale and, particularly, some of the dimensions are for the clarity of presentation and are shown exaggerated in the drawing Figures. Similarly, although the views in the drawings for the ease of description generally show similar orientations, this depiction in the Figures is arbitrary for the most part. Generally, the invention can be operated in any orientation.

NOTATION AND NOMENCLATURE

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "accessing" or "executing" or "storing" or "rendering" or the like, refer to the action and processes of a computer system, or similar electronic computing device, that manipulates and transforms data represented as physical (electronic) quantities within the computer system's registers and memories and other computer readable media into other data similarly represented as physical quantities within the computer system memories or registers or other such information storage, transmission or display devices. When a component appears in several embodiments, the use of the same reference numeral signifies that the component is the same component as illustrated in the original embodiment.

Clock Data Recovery Circuit

In a signal transmitted primarily in a PRBS pattern in compliance with the 128b/130 encoding scheme, the probability of a long clock pattern is very small. For example, the probability of a clock sequence of 101010 is about 0.4% in Modified Compliance Pattern (MCP), and the probability of a longer clock sequence 1010101010 is only 0.06%. Embodiments of the present disclosure introduce a data pattern filter mechanism to a CDR circuit such that the CDR phase will be frozen when the data sampler detects the long clock pattern until the data pattern becomes random or pseudo random again.

Figure 3A:
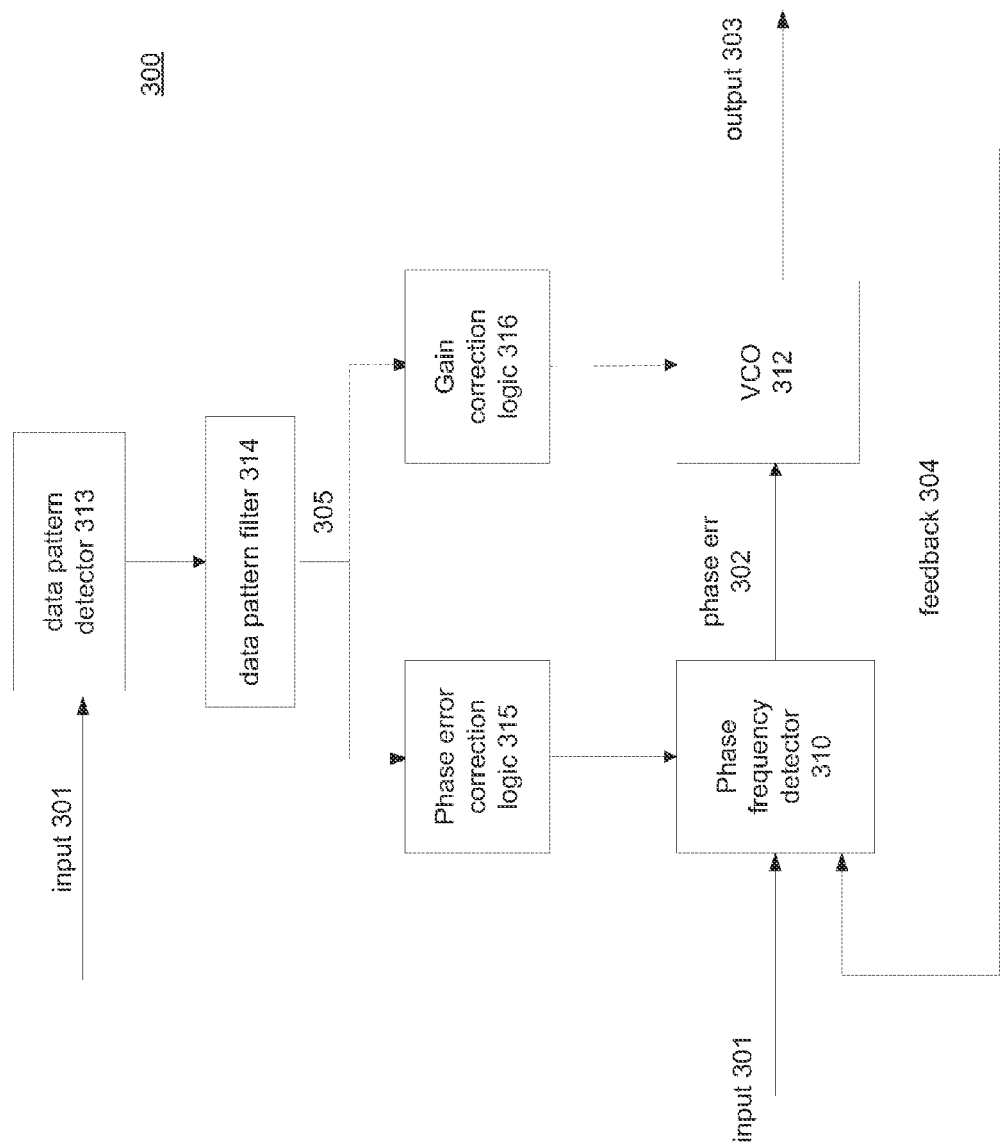
FIG. 3A is a function block diagram illustrating an exemplary clock data recovery (CDR) circuit that employs data filtering logic in accordance with an embodiment of the present disclosure.

FIG. 3A is a function block diagram illustrating an exemplary clock data recovery (CDR) 300 circuit in accordance with an embodiment of the present disclosure. The CDR includes a phase frequency detector (PFD) 310, a voltage controlled oscillator (VCO) 312 and a feedback loop that feeds the VCO output 303 back to the PFD 310. Also included are a data pattern detector 313, a data pattern filter 314, and a phase error correction logic 315 coupled to the PFD 310 or a gain correction logic 316 coupled to the VCO 312.

When receiving an input signal 301, the PFD 310 is capable of detecting a phase difference between the input signal 301 and a corresponding feedback signal 304 of the CDR 300 and producing a phase error signal 302 proportional to the difference. The phase error signal 302 can be converted to a control voltage, e.g., by logic inside the VCO, to adjust the frequency of the VCO output 303 in order to match the frequencies between the input signal 301 and the output signal 303. The output signal 303 represents a clock signal extracted from an input data signal for instance.

At the same time, the data pattern detector 313 functions to detect the data patterns of the input signal 301. Based on the detected data pattern, the data pattern filter 314 can selectively generate a filter indication 305 indicating to freeze or suppress the CDR phase shift. Thereby an abrupt phase change and the consequential timing margin loss that are resultant from a data pattern transition can be advantageously eliminated in accordance with an embodiment of the present disclosure. For example, once a clock pattern is detected by the data pattern detector 313 following a PRBS pattern, and despite the phase difference detected by the PFD 310, the CDR phase variation can be forced to be zero such that the frequency or phase of the output signal 303 is not affected by the data pattern transition.

In general, the CDR output from the VCO is directly controlled by the control voltage driving the VCO 312 which is a product of a phase error signal and a CDR gain. Accordingly, in one approach, the filter indication 305 can be utilized to modify the phase error signal 302, which can result in a modified control voltage reflecting the filtering effect. In some embodiments, a phase error correction logic 315 coupled to the data pattern filter 314 can be used to incorporate the filter indication 305 into the phase error signal 302. For example, when a clock pattern is detected in 313 and a filter indication 305 is produced, the PFD 310 can disregard the large phase difference and instead output a phase error signal 302 of a minimal value. Hence the phase/frequency variations of the output signal 303 can be maintained within a small range during this period, as if no data pattern transition occurs. In this mannter, the CDR phase can be frozen during the clock pattern period.

In another approach, the filter indication 305 can be used to adjust the gain of the control voltage, which can also effectively block the data pattern transition impact on the CDR phase shift. In some embodiments (see the dotted path), a gain correction logic 316 coupled to the data pattern filter 314 can incorporate the filter indication 305 in the generation the control voltage by scale down the gain value to throttle the CDR shift. For example, when a clock pattern following a PRBS pattern is detected in 313, a filter indication 305 can cause the gain value and the control voltage to be forced to a minimal value as if the phase detector 310 only receives continuous PRBS as the input signal 301.

In a third approach, switch logic can directly turn on or off the phase error signal, the gain, or the control voltage in response to detection of a clock pattern in the input signal. In still some other approaches, the combination of the foregoing approaches and logic circuitry can be used to achieve an equivalent effect.

Figure 3B:
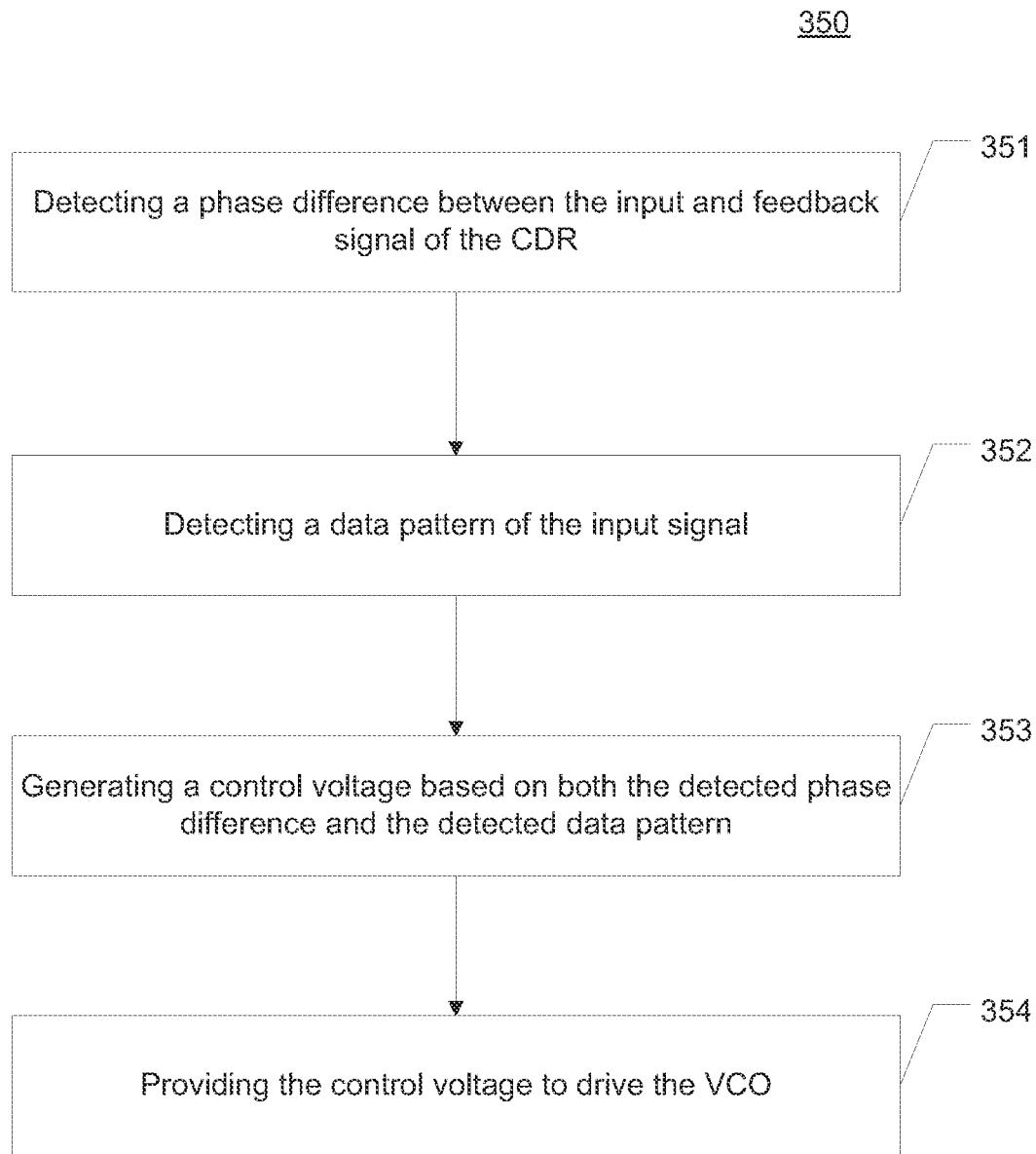
FIG. 3B is a flow chart depicting an exemplary method of optimizing the CDR performance by selectively freezing the CDR phase based on the data patterns of the input signal in accordance with an embodiment of the present disclosure.

FIG. 3B is a flow chart depicting an exemplary method 350 of improving the CDR performance by selectively freezing the CDR phase based on the data patterns of the input signal in accordance with an embodiment of the present disclosure. The method 350 can be implemented with a circuitry with similar configuration of FIG. 3A. At 351, a phase difference between the input signal and the feedback signal of the CDR circuit is detected. At 352, data patterns in the input signal can be detected. For instance, the input signal may include data information transmitted in a PRBS pattern and ordered set headers transmitted in clock pattern in compliance with 128b/130b encoding scheme. At 353, a control voltage is generated based on both the detected phase difference and the detected data pattern. At 354, the control voltage is provided to an oscillator circuit to adjust its output frequency so as to match the input and output frequency. The oscillator circuit may comprise a VCO or a digital controlled oscillator or any other suitable circuit with variable frequency capability.

Figure 4A:
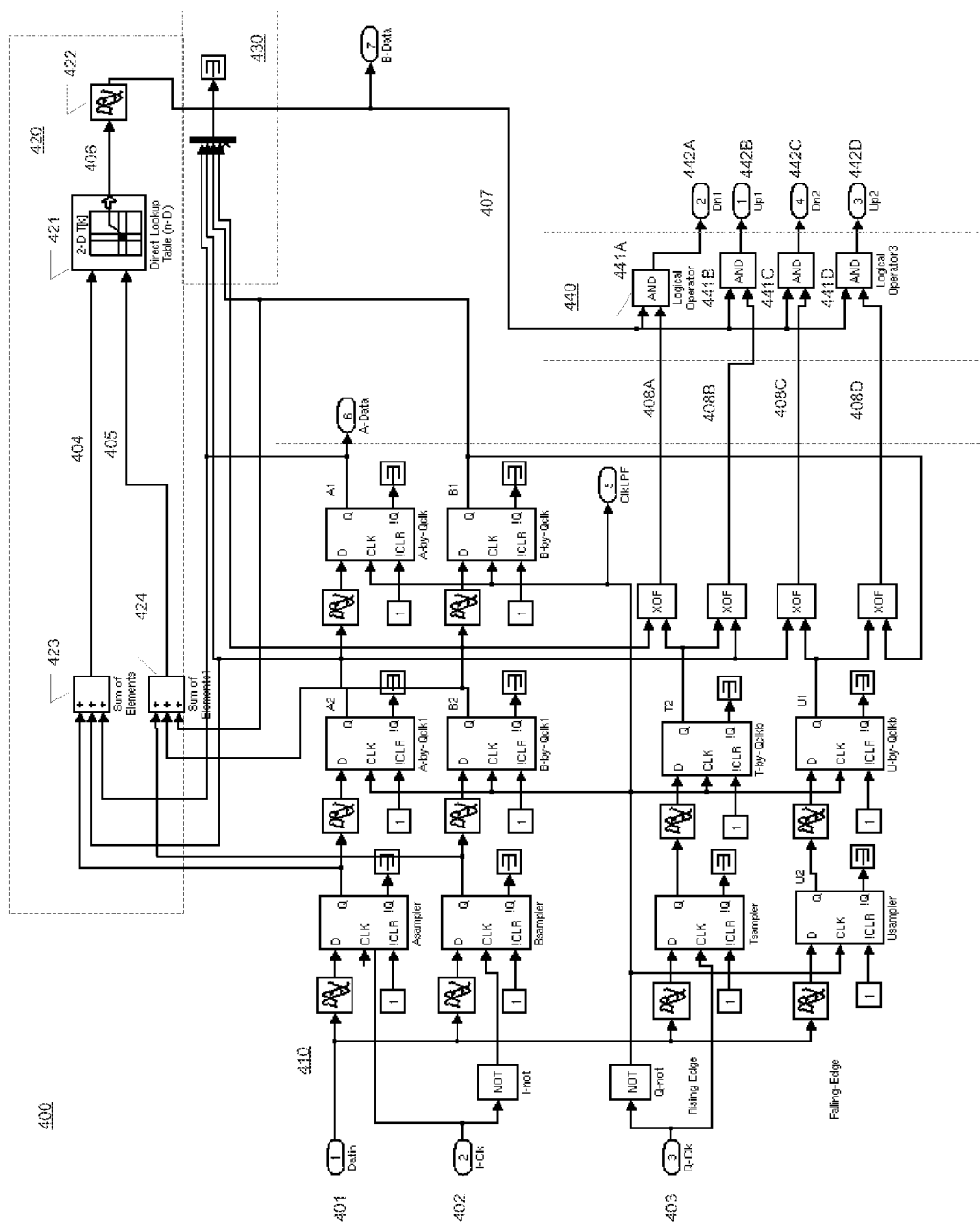
FIG. 4A is a block diagram illustrating an exemplary configuration of a modified PFD that can selectively filter the phase error based on the data patterns of the CDR input signal in accordance with an embodiment of the present disclosure.

FIG. 4A is a block diagram illustrating an exemplary configuration of a modified PFD 400 that can selectively filter the phase error based on the data patterns of the CDR input signal in accordance with an embodiment of the present disclosure. The section 410 illustrates a typical configuration of a conventional half-rate PFD that is well known in the art. Input signals comprising two or more data patterns are received at the port of Datain 401 and the feedback signals are received at the ports of I-Clk 402 and Q-Clk 403. The modified PFD 400 additionally includes a data pattern detection module 420 configured to detect presence of a clock pattern, and an AND module 440 configured to filter the phase error caused by the clock pattern. The section 430 includes components used for simulation and monitoring purposes.

In the illustrated embodiment, the data pattern detection module 420 comprises a lookup table 421, a delay circuit 422 and two summing circuits 423 and 424. Samples of the signal from Datain 401, I-Clk 402 and Q-Clk 403 at the rising edges can be summed together in the summing circuit 423 to generate, whiles samples of their falling edges can be summed together in another summing circuit 424. Provided with the summed signals 404 and 405, the lookup table 421 can identify the instant data pattern in the input signal. If the summed signals 404 and 405 indicate the presence of a PRBS in the input signal, the lookup table 421 can output logic "1." In the events that the presence of a clock pattern is indicated, the lookup table can output logic "0" as a filter indication. The delay circuit 422 can add a configurable time delay to the lookup table output 406 for synchronizing the filter indication with the CDR phase.

The AND logic module 440 is configured to perform AND operations on the delayed output 407 of the lookup table 421 and the original phase error signal including the components of 408A-D, respectively. In effect, the AND module outputs a normal phase error signal proportional to the phase difference in response to a PRBS pattern, while it outputs a logic "0" in response to detection of a clock pattern, and thus the detected phase difference is filtered. The AND module outputs 442A-D, or the filtered phase error signal, can then be used to drive a VCO through an up/down counter and a low pass filter, for instance.

FIG. 4B is a flow chart depicting an exemplary method 450 of generating a filtered phase error signal based on the data pattern of the input signal in accordance with an embodiment of the present disclosure. The method 450 can be implemented by a circuit similarly configured as FIG. 4A. At 451, an original phase error signal proportional to a phase difference between the input signal the feedback signal of the CDR is generated. If a long clock pattern is detected in the input signal, e.g. 101010, a logic "0" signal is output from a lookup table, and optionally a time delay is added at 454. At 455, an AND operation is performed on the logic "0" signal and the original phase error signal, and so logic "0" is output by the modified PFD and provided to the VCO at 456. On the other hand, if no clock pattern is detected at 452, the original phase error signal will be output at 456 and provided to VCO.

Figure 5:
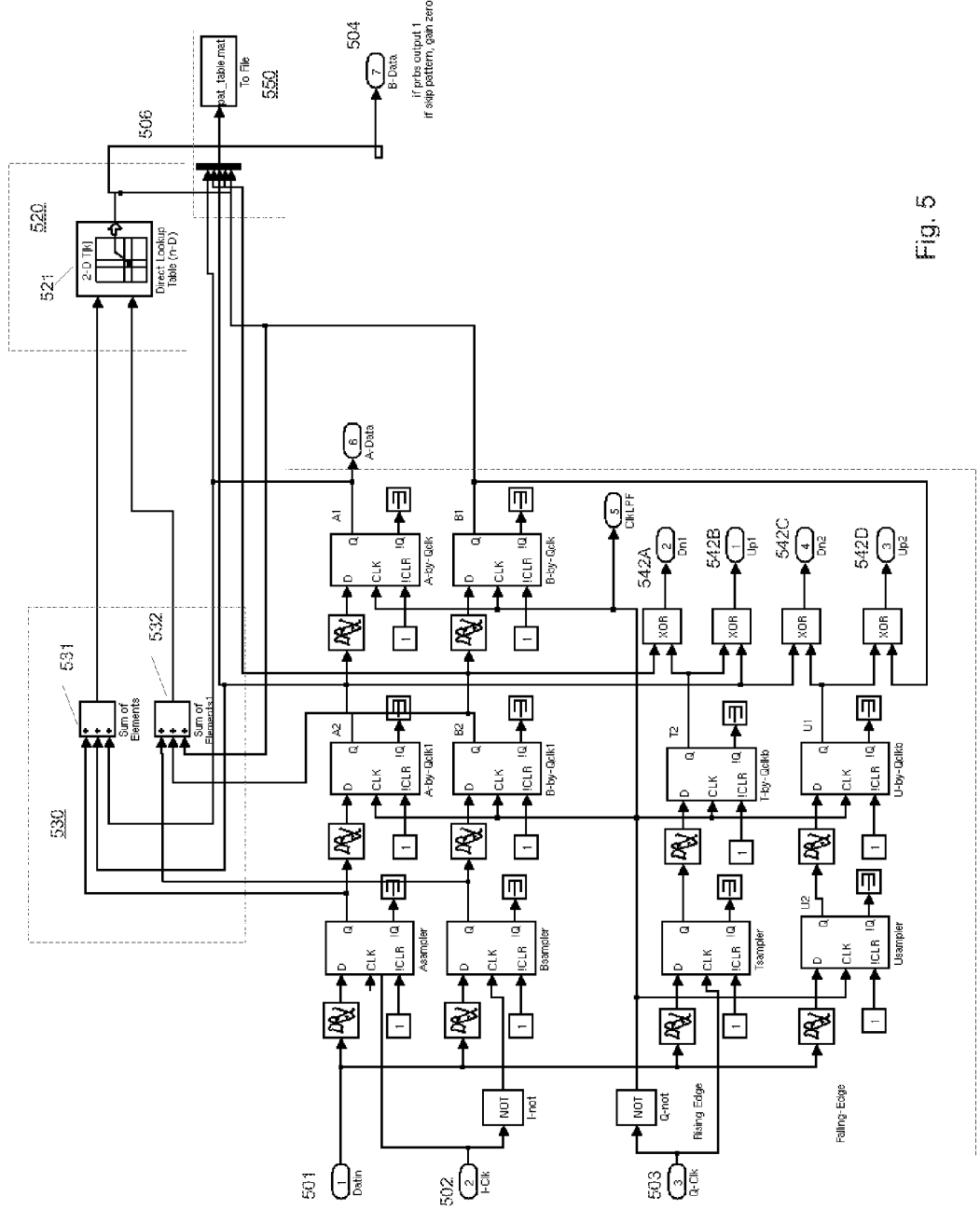
FIG. 5 is a block diagram illustrating an exemplary configuration of a modified PFD operable to output a gain control signal based on the data patterns of the CDR input signal in accordance with an embodiment of the present disclosure.

FIG. 5 is a block diagram illustrating an exemplary configuration of a modified PFD 500 operable to output a gain control signal 506 based on the data patterns of the CDR input signal in accordance with an embodiment of the present disclosure. The PFD 500 has a similar configuration with PFD 400 in FIG. 4A but includes no AND module 440 of PFD 400. The PFD 500 can receive the input signal and the feedback signals at the ports of at the port of Datain 501, I-Clk 502 and Q-Clk 503, respectively. The PFD 500 can output the unfiltered phase error signal at ports 542A-D. Moreover, the lookup table 520 can cooperate with the summing module 530 to output a gain control signal 506 at the port 504. The gain control signal 506 can then be used to scale down the gain of the control voltage applied to the VCO in response to detection of a clock pattern in the input signal. In some embodiments, if a PRBS is detected in the input signal, the gain control signal 506 is set to 1; whereas, if a clock pattern is detected, the gain control signal 506 is set to a minimal value, e.g. 0 or 0.001.

Figure 6:
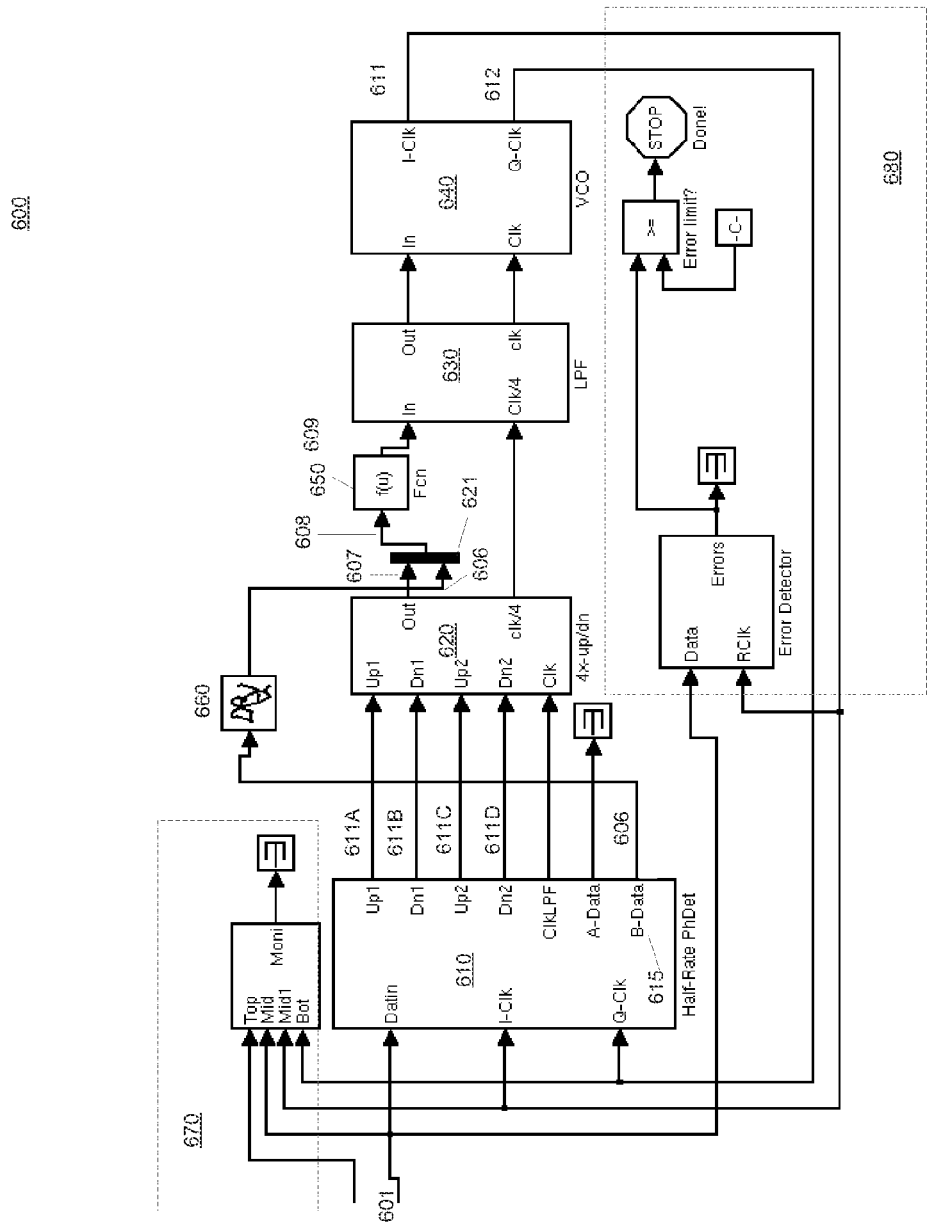
FIG. 6 is a block diagram illustrating an exemplary configuration of an adaptive CDR capable of scaling down a VCO gain value in response to a gain control signal output from a modified PFD in accordance with an embodiment of the present disclosure.

FIG. 6 is a block diagram illustrating an exemplary configuration of an adaptive CDR 600 capable of scaling down a VCO gain value in response to a gain control signal 606 output from a modified PFD 610 in accordance with an embodiment of the present disclosure. The CDR 600 includes a modified PFD 610, a 4× up/down counter 620, a LPF 630 and a VCO 640. The PFD 610 has the similar configuration and function with PFD 500 in FIG. 5. An unfiltered phase error signal can be output at port 611A-D. A filter indication can be included in a gain control signal 606 and output at B-data port 615. Section 660 includes circuitry use for simulation and monitoring purposes.

The gain control signal 606 and the output 607 of the up/down counter 620 can be merged through a bus 621 and multiplied through a gain function generator f(u) 650. The gain control signal can be set to 1 in response to a PRBS pattern, and so the gain function generator f(u) 650 can generate a normal gain value without modification, resulting in a normal control voltage 609. On the other hand, the gain control signal can be set to 0, 0.001, or any other suitable minimal value, in response to a clock pattern. In effect, the gain value and the control voltage can be scaled down to 0 or by 0.001 for example.

Figure 7:
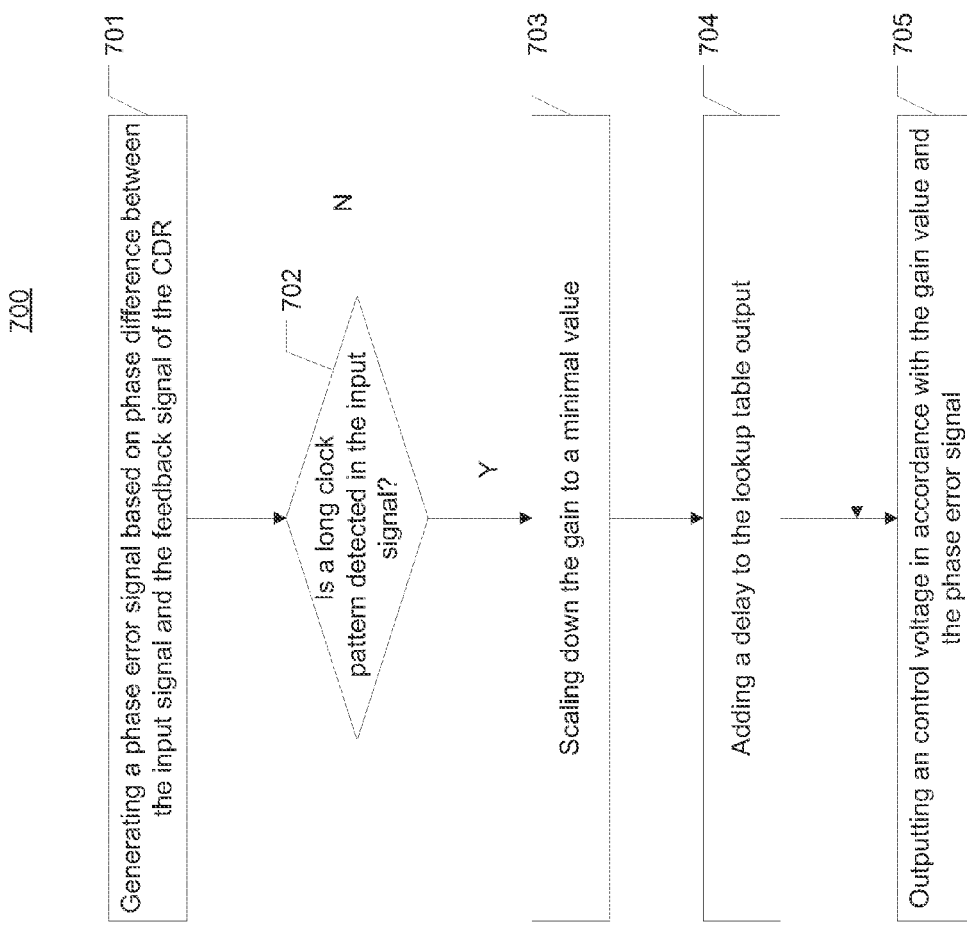
FIG. 7 is a flow chart depicting an exemplary method of selectively freezing the CDR phase based on a gain control signal generated by a modified PFD in accordance with an embodiment of the present disclosure.

FIG. 7 is a flow chart depicting an exemplary method 700 of selectively freezing the CDR phase based on a gain control signal generated by a modified PFD in accordance with an embodiment of the present disclosure. The method 700 can be implemented with circuits having similar configuration with FIG. 6. At 701, a phase error signal proportional to the phase difference between the input signal and the feedback signal is generated. If it is determined that a long clock pattern is detected at 702, the gain value of the control voltage is scaled down to a minimal value at 703. A time delay can be added at 704. A control voltage of minimal value can be generated at 705 based on the gain value. On the other hand, if a PRBS pattern is detected, the gain value is unchanged by the gain control signal and output at 705.

Figure 8:
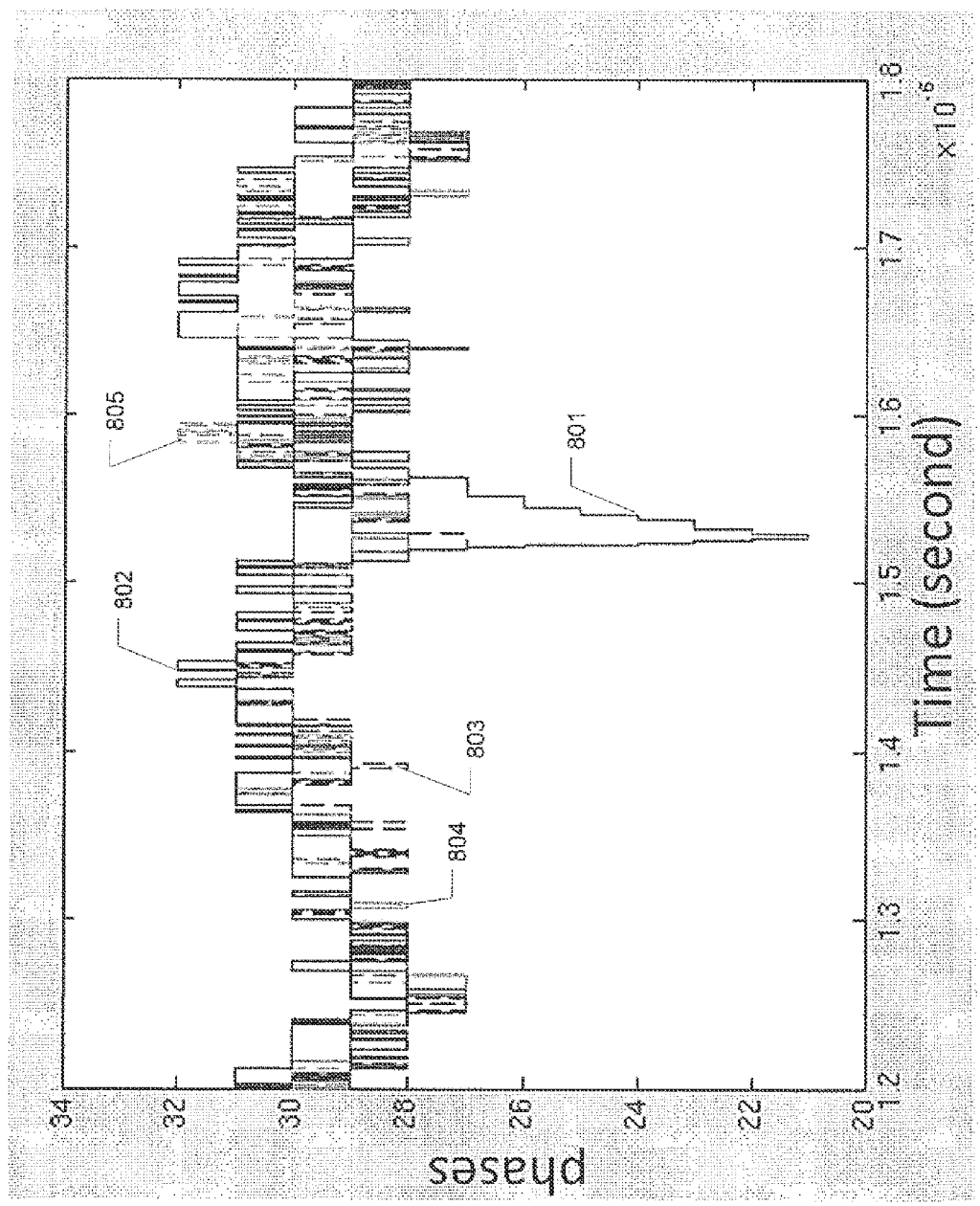
FIG. 8 are exemplary simulated results of CDR phase output in accordance the prior art and embodiments of the present disclosure.

FIG. 8 illustrates simulated results of CDR phase output in accordance the prior art and embodiments of the present disclosure. The input signal comprises a MCP that has passed PCIe 3 RX compliance test channel. The plot 801 shows the CDR phase output in a conventional CDR circuit, which includes an abrupt phase drop caused by a clock signal 101010 in the CDR input signal. The plots 802 and 803 show simulated results of CDR phase output by employing a modified PFD that has a similar configuration as the PFD 400 in FIG. 4, with zero delay and 8 bits delay added respectively. The plots 804 and 805 show simulated results of CDR phase output by employing an adaptive CDR that has a similar configuration as the CDR 600 in FIG. 6, with zero delay and 8 bits added delay respectively. The plots 802-805 resulted from all four embodiments in accordance with the present disclosure demonstrate that the abrupt phase drop present in 801 has been successfully avoided, which confirms validity and efficacy of the data pattern filter mechanism presented herein in stabilizing the CDR phase output and therefore preserving the time margin. Moreover, the plots 802-805 show that the CDRs of different embodiments take similar time to lock, regardless of the different delay time added to the filtering path, implying that there is at most inconsequential sacrifice in terms of CDR locking performance.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A method of reconstructing clock signals according to input signals in a data transmission receiver, said method comprising:
   receiving an input signal comprising a plurality of data patterns;
   detecting a phase difference between said input signal and a feedback signal of a clock data recovery (CDR) circuit;
   detecting a data pattern of said input signal;
   generating a control signal in accordance with said phase difference and said data pattern, wherein said generating comprises attenuating said control signal responsive to detection of a data pattern transition; and
   providing said control signal to an oscillator circuit to generate an output signal of said CDR circuit.

2. The method of claim 1, wherein said plurality of data patterns comprises a first data pattern and a second data pattern, and further comprising:
generating a first phase error signal based on said phase difference;
modifying said first phase error signal to generate a second phase error signal in response to detection of said first data pattern within said input signal until detection of said second data pattern within said input signal; and
generating said control signal based on said second phase error signal.

3. The method of claim 2, wherein said modifying said first phase error signal comprises:
outputting logic "0"s; and performing an AND logic operation on said logic "0"s and said first phase error signal to generate said second phase error signal.

4. The method of claim 3 further comprising adding a time delay to said second phase error signal.

5. The method of claim 1, wherein said plurality of data patterns comprises a first data pattern and a second data pattern, and further comprising:
generating a phase error signal based on said phase difference; and
converting said phase error signal to a voltage of said control signal by multiplying said phase error signal with a gain function, wherein said gain function is configured to be a minimal value if said first data pattern is detected within said input signal until said second data pattern is detected within said input signal subsequently.

6. The method of claim 3 further comprising adding an 8-bit delay to said second phase error signal in response to detection of said first data pattern.

7. The method of claim 1, wherein said first data pattern comprises a clock pattern, and wherein said second data pattern comprises a scrambled data pattern.

8. The method of claim 1, wherein said input signal comprises an ordered set block and a data block in compliance with a version of a PCIe 3.0 encoding scheme.

9. A clock data recovery (CDR) circuit comprising:
a phase frequency detector configured to receive an input signal comprising a first data pattern and a second data pattern, and to generate a phase error signal representing a phase difference between said input signal and a feedback signal of said CDR circuit;
a data pattern filter configured to detect data patterns of said input signal and to generate a filtering indication in response to detection of said first data pattern within said input signal; and
an oscillating element coupled to said data pattern filter, said oscillating element configured to generate an output signal of said CDR circuit in response to a control signal that is determined by said phase difference and said filtering indication, wherein said control signal is attenuated responsive to detection of a data pattern transition.

10. The CDR circuit of claim 9 further comprising:
an up/down counter coupled to said phase frequency detector and operable to convert phase differences to control signals for controlling said oscillating element; and
a low pass filter coupled between said up/down counter and said oscillating element.

11. The CDR circuit of claim 10, wherein said data pattern filter is integrated with said phase frequency detector, and wherein said data pattern filter comprises:
a lookup table configured to: detect data patterns of said input signal; output a logic "0" as said filtering indication in response to detection of said first data pattern within said input signal; and output a logic "1" in response to detection of said second data pattern within said input signal; and
an AND logic module coupled to said lookup table and configured to: perform an AND operation between an output of said lookup table and said phase error signal to generate a modified phase error signal that is provided to said up/down counter.

12. The CDR circuit of claim 11, wherein said data pattern filter further comprises a delay circuit coupled between said lookup table and said AND logic module, wherein said delay circuit is configured to add a configurable time delay to an output of said lookup table.

13. The CDR circuit of claim 10, wherein said data pattern filter comprises:
a lookup table coupled to said phase frequency detector and configured to: detect data patterns of said input signal; and output a minor coefficient as said filter indication upon detection of said first data pattern within said input signal; and
multiplication logic coupled to said lookup table and said up/down counter, wherein said multiplication logic is configured to multiply said minor coefficient with a control signal output from said up/down counter in response to detection of said first data pattern; and to output a scaled control signals that is provided to said oscillating element.

14. The CDR circuit of claim 13, wherein said first data pattern corresponds to a clock pattern, wherein said second data pattern corresponds to a scrambled pattern, and wherein said first data pattern and said second data pattern are transmitted in different bit rates.

15. An integrated circuit for clock and data recovery from data received through a series link, said integrated circuit comprising:
a phase frequency detector configured to: receive an input signal comprising a first component and a second component; detect a phase difference between said input signal and a feedback signal of a clock data recovery (CDR) loop; and generate a first phase error signal;
a lookup table configured to: identify said first component within said input signal; and output a filter indication in response to identifying said first component; and
a voltage controlled oscillator (VCO) configured to generate a clock signal at an output of said CDR in response to a control signal that is determined by said phase difference and said filter indication, wherein said control signal is attenuated responsive to detection of a data pattern transition.

16. The integrated circuit of claim 15, wherein said first component corresponds to a header of a data block, wherein said second component corresponds to a payload of a data block.

17. The integrated circuit of claim 15, wherein said lookup table is an integral part of said phase frequency detector and operable to output logic "1"s as said filter indication, further comprising:
a summing module coupled to said lookup table;
AND logic configured to perform AND logic operation on said filter indication and said first phase error signal to generate a second phase error signal; and
an up/down counter coupled to said phase frequency detector and operable to convert said second phase error signal to said control signal.

18. The integrated circuit of claim 15 further comprising:
an up/down counter coupled to said phase frequency detector and operable to output a first control signal proportional to said detected phase difference; and
a multiplication unit coupled to said up/down counter, said multiplication unit operable to scale down said first control signal by a minimal gain coefficient in response to said filter indication; and output said control signal.

19. The integrated circuit of claim 18, wherein said multiplication unit is an integral part of said VCO.

20. The integrated circuit of claim 16 further comprising delay logic operable to add a time delay to said filter indication.

* * * * *